(12) United States Patent
Chia et al.

(10) Patent No.: US 7,787,313 B2
(45) Date of Patent: Aug. 31, 2010

(54) BITLINE VOLTAGE DRIVER

(75) Inventors: Chieu Yin Chia, San Jose, CA (US); Michael Achter, Mountain View, CA (US); Harry Kuo, Cupertino, CA (US); Boon-Aik Ang, Santa Clara, CA (US)

(73) Assignee: Spansion LLC, Sunnyvale, CA (US)

( * ) Notice: Subject to any disclaimer, the term of this patent is extended or adjusted under 35 U.S.C. 154(b) by 359 days.

(21) Appl. No.: 12/057,203

(22) Filed: Mar. 27, 2008

(65) Prior Publication Data
US 2009/0244989 A1 Oct. 1, 2009

(51) Int. Cl.
*G11C 7/10* (2006.01)
(52) U.S. Cl. ............... 365/189.06; 365/189.11
(58) Field of Classification Search ............ 365/189.06, 365/189.09, 189.11
See application file for complete search history.

(56) References Cited

U.S. PATENT DOCUMENTS

| | | | | |
|---|---|---|---|---|
| 5,673,219 | A | * | 9/1997 | Hashimoto ................... 365/149 |
| 5,796,650 | A | * | 8/1998 | Wik et al. .................... 365/150 |
| 7,529,135 | B2 | * | 5/2009 | Pan et al. ................ 365/185.21 |
| 7,701,774 | B2 | * | 4/2010 | Spitz ..................... 365/185.21 |

* cited by examiner

*Primary Examiner*—Anh Phung

(57) ABSTRACT

A method and structure for passing a bitline voltage regardless of its voltage level via a bitline in a memory device is disclosed. In one embodiment, the method includes detecting the bitline voltage of the bitline, feeding a control signal at an activation voltage level to the bitline pass device to maintain a pass voltage differential of the bitline pass device when the bitline is selected and passing the bitline voltage via the bitline pass device in response to the control signal, where the pass voltage differential is greater than a threshold voltage of the bitline pass device regardless of a level of the bitline voltage.

20 Claims, 9 Drawing Sheets

BITLINE VOLTAGE DRIVER

FIELD OF TECHNOLOGY

This disclosure relates generally to the technical field of semiconductor manufacturing, and in one embodiment, to a method and system of passing a bitline voltage via a bitline.

BACKGROUND

Electronic systems and circuits have made a significant contribution towards the advancement of modern society and are utilized in a number of applications to achieve advantageous results. Electronic technologies such as digital computers, calculators, audio devices, video equipment, and telephone systems have facilitated increased productivity and reduced costs in analyzing and communicating data, ideas and trends in most areas of business, science, education and entertainment. Frequently, electronic systems designed to provide these results include integrated circuits, and the integrated circuits can be adversely impacted by a variety of issues. A number of issues such as leakage currents, voltage level breakdown, and other concerns can be very problematic in a number of traditional integrated circuit techniques.

Some traditional approaches have attempted to resolve leakage current issues by increasing supply voltage levels. However, increasing voltage levels in conventional systems can cause detrimental impacts including component breakdown and unreliable performance. FIG. 1 is a block diagram of a conventional bitline system 100. Bitline system 100 includes a pass transistor 108 and a protection device 114. Pass transistor 108 can not safely pass high voltage signals. In addition, larger components, such as a protection device 114, are often required to protect or isolate the components from higher level bitline voltages, thus further restraining die space. Thus, conventional systems are usually limited in the amount of voltage they can safely pass and often inadequate to address load requirements, leakage, and other concerns.

SUMMARY

This summary is provided to introduce a selection of concepts in a simplified form that are further described below in the detailed description. This summary is not intended to identify key features or essential features of the claimed subject matter, nor is it intended to be used to limit the scope of the claimed subject matter.

An embodiment described in the detailed description is directed to a bitline voltage system comprising a bitline pass device for passing a bitline voltage via a bitline and a voltage control module to control the bitline pass device. The voltage control module can selectively maintain a pass voltage differential that enables the bitline pass device to pass a bitline voltage when the bitline is selected. The pass voltage differential is greater than a threshold voltage of the bitline pass device regardless of the level of the bitline voltage as long as the bitline voltage does not cause the breakdown of the bitline pass device.

As illustrated in the detailed description, other embodiments pertain to methods and systems for forwarding various levels of the bitline voltage in an integrated circuit memory device. In one embodiment, maintaining the pass voltage differential of the bitline pass device enables the integrated circuit memory device to pass the bitline voltage at various voltage levels.

BRIEF DESCRIPTION OF THE DRAWINGS

Example embodiments are illustrated by way of example and not limitation in the figures of the accompanying drawings, in which like references indicate similar elements and in which.

Other features of the present embodiments will be apparent from the accompanying drawings and from the detailed description that follows.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the claims. Furthermore, in the detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Briefly stated, embodiments can selectively pass a bitline voltage regardless of its voltage level by maintaining the pass voltage differential of the bitline pass device driving the bitline voltage. In one embodiment, a voltage control module intelligently adjusts a voltage level of the control signal forwarded to the bitline pass device to appropriately correspond to the bitline voltage regardless of the level of the bitline voltage.

Figure 1:
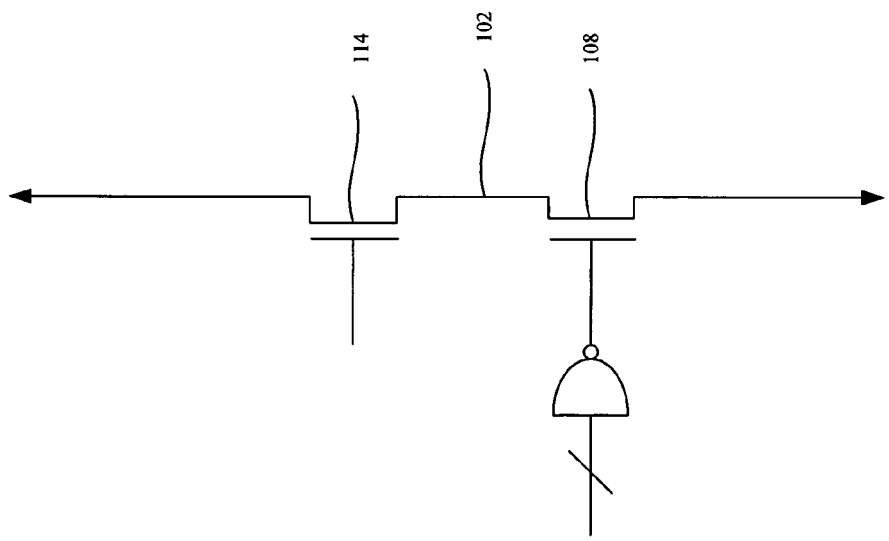
FIG. 1 is a block diagram of a conventional bitline voltage system.
Figure 2:
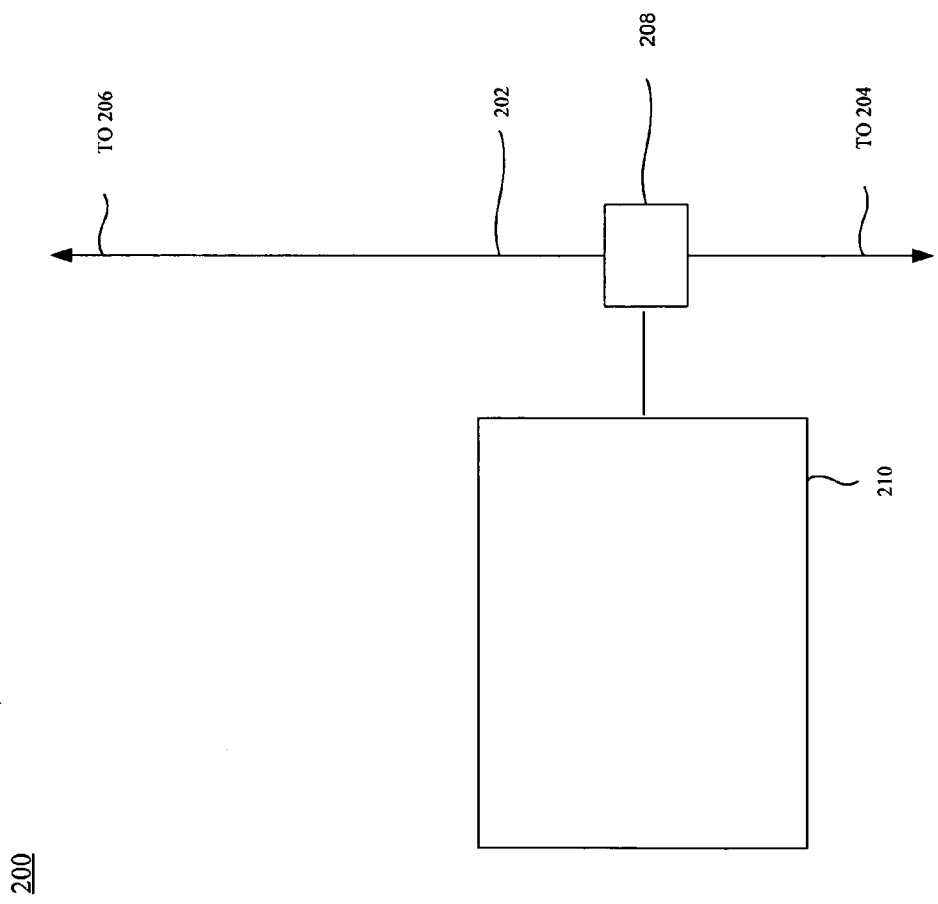
FIG. 2 is a block diagram of an exemplary bitline voltage system in accordance with one embodiment of the present invention.

FIG. 2 is a block diagram of an exemplary bitline voltage system 200 in accordance with one embodiment of the present invention. In FIG. 2, a bitline pass device 208 on a bitline 202 is coupled between a bitline voltage node 204 and a memory cell node 206. In one exemplary implementation, the memory node 206 is coupled to a virtual source or virtual drain of a memory cell. The bitline pass device 208 is used to pass the bitline voltage to the memory cell node 206. It is appreciated the memory cell node 206 can be coupled to other component(s) of the integrated circuit memory device. It is appreciated that the memory cell node 206 can be coupled to one or more memory cells and the memory cells can be configured by a wordline. Alternatively, the bitline pass device 208 can also be utilized to isolate or protect the memory cell 206. In one embodiment, the bitline voltage system 200 also includes a voltage control module 210 to control the bitline pass device 208. The bitline pass device 208 is controlled by selectively maintaining a pass voltage differential that enables the bitline pass device 208 to pass the bitline voltage when the bitline 202 is selected where the pass voltage differential is greater than a threshold voltage (e.g., 1 volt) of the bitline pass device 208 regardless of a level of the bitline voltage. It is appreciated that the level of the bitline voltage which is limited by a breakdown voltage of the bitline pass device.

In one exemplary embodiment, the voltage control module is a variable voltage control module for forwarding a control signal in response to various voltage levels (e.g., the bitline voltage greater than 1 volt) in the bitline voltage. In another example embodiment, the pass voltage differential is less than a positive supply voltage ($V_{cc}$) of the memory device minus the threshold voltage.

In one exemplary embodiment, the bitline pass device 208 comprises a pass transistor. For example, the bitline pass device 208 can include a NMOS transistor which enables or stops the flow of the bitline voltage to the memory cell 206 in response to a control signal from the voltage control module 210. If the control signal is set to enable the flow, the gate to source voltage difference (e.g., the pass voltage differential) is maintained above the threshold voltage level of the NMOS transistor, thus keeping the NMOS on. Otherwise, if the control signal is set to disable the flow, the control signal maintains the gate to source voltage difference below the threshold voltage of the NMOS. It is appreciated that transistor types such as FETs, BJTs, etcetera can be included in the bitline pass device 208 to realize a similar or same result.

Figure 3:
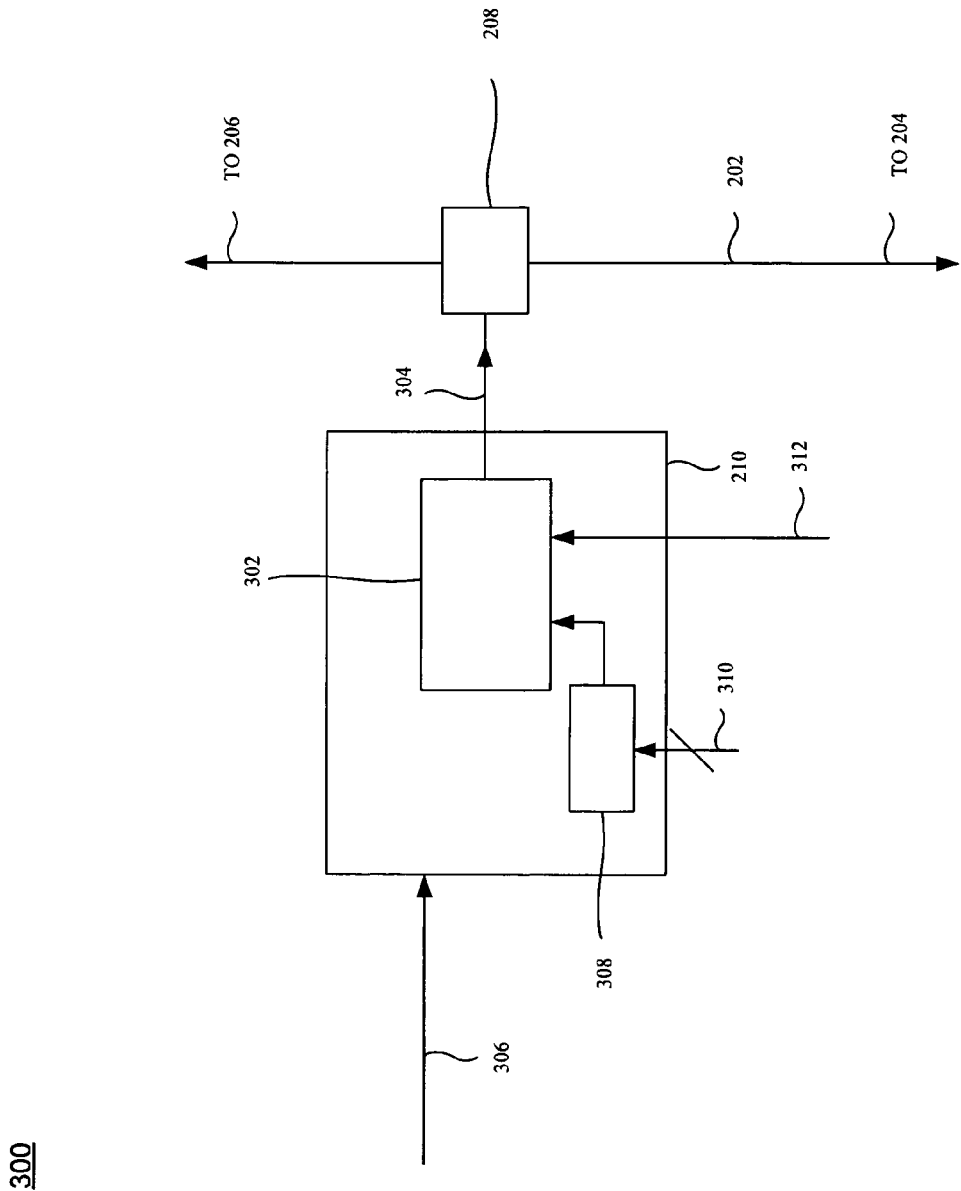
FIG. 3 is a block diagram of an exemplary voltage control module for controlling a bitline pass device in accordance with one embodiment of the present invention.

FIG. 3 is a block diagram of an exemplary voltage control module 210 for controlling the bitline pass device 208 of FIG. 2 in accordance with one embodiment of the present invention. In FIG. 3, the voltage control module 210 is coupled to the bitline pass device 208 of the bitline voltage system 200 of FIG. 2. The voltage control module 210 includes a voltage level adjuster 302 and a bitline select module 308.

In one embodiment, the voltage level adjuster 302 forwards a control signal 304 to control the bitline pass device 208, and the bitline select module 308 selects a voltage level of the control signal 304. In addition, the control signal 304 is selectively set at an activation voltage level that maintains a pass voltage differential regardless of the level of the bitline voltage when the bitline 202 associated with the bitline pass device 208 is selected, whereas the control signal 304 is at a deactivation voltage level that turns off the bitline pass device 208 when the bitline 202 is not selected. It is appreciated the bitline voltage and/or the gate voltage of the bitline pass device 208 is limited by a breakdown voltage of the bitline pass device 208.

In one example embodiment, the voltage level of the control signal 304 is determined based on the bitline voltage, a threshold voltage of the bitline pass device 208, a positive supply voltage ($V_{cc}$) 306 and/or one or more bitline control signals 310 of the memory device. Moreover, the bitline select module 308 includes a logic circuit to select between the activation voltage level and the deactivation voltage level based on the bitline control signals 310.

In one exemplary embodiment, the voltage level of the control signal 304 is configured in response to a voltage level configuration signal 312. The voltage level configuration signal 312 can be communicated to the voltage level adjuster 302 to set the activation voltage level or the deactivation voltage level during the configuration stage of a memory device. A voltage level configuration signal 312 can also be communicated to the voltage level adjuster 302 to set the activation or deactivation voltage level in response to a change in the level of the bitline voltage node 204.

It is appreciated that the voltage levels adjuster 302 can be readily implemented in a variety of configurations. The voltage level adjuster 302 can include a voltage level shifter, a multiplexer or a voltage divider. The voltage level shifter or the voltage divider may be used to transform the positive supply voltage ($V_{cc}$) 306 or ground voltage to the activation level voltage or the deactivation level voltage. The multiplexer can be utilized in the voltage control module 210 to select a voltage level for the control signal 304 from among various voltage levels fed to the multiplexer.

Figure 4:
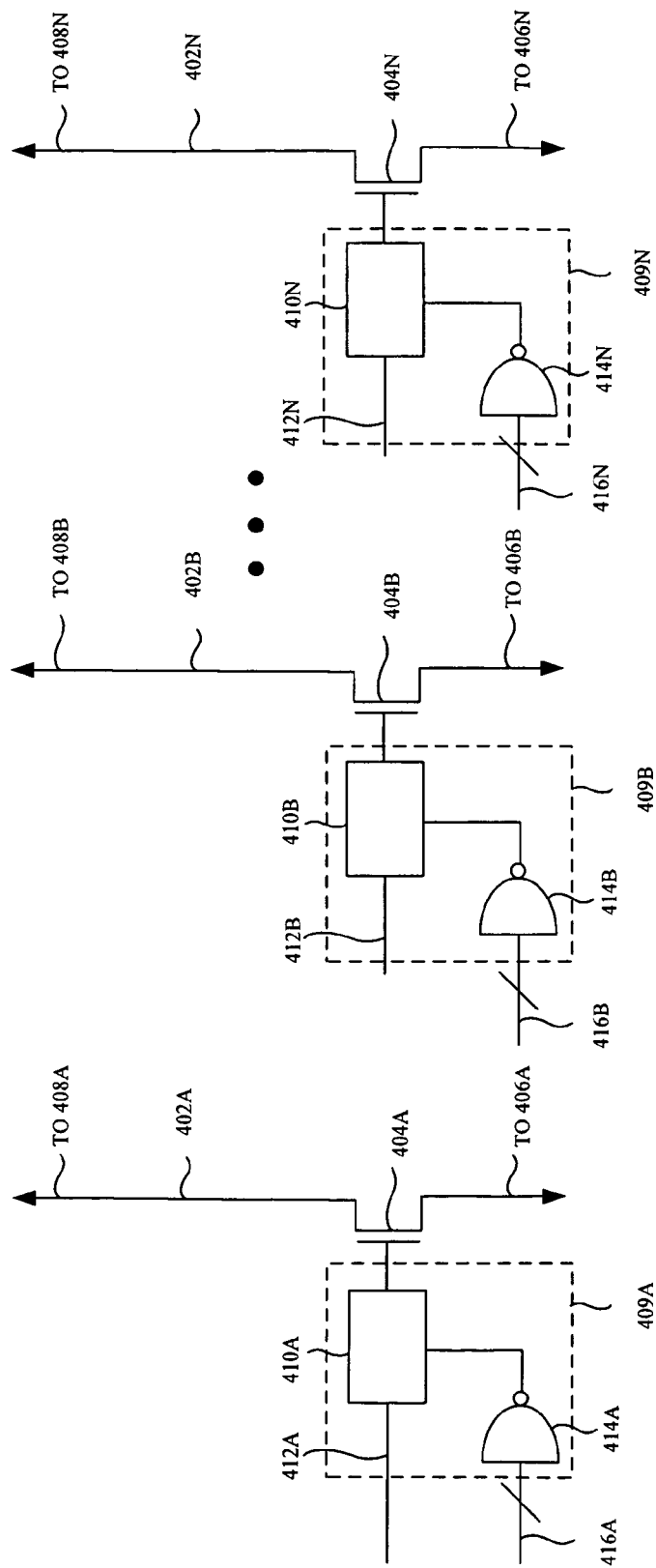
FIG. 4 is a block diagram of an exemplary bitline voltage system with a plurality of voltage control modules controlling a plurality of bitlines in accordance with one embodiment of the present invention.

FIG. 4 is a block diagram of an exemplary bitline voltage system 400 with a voltage control module controlling a single bitline in accordance with one embodiment of the present invention.

As illustrated in FIG. 4, a memory device may have multiple bitlines (e.g., 402A, 402B, 402N, etc.). A bitline pass device (e.g., a bitline pass device 404A, a bitline pass device 404B, a bitline pass device 404N, etc.) on each of the bitlines is coupled between a bitline voltage node (e.g., a bitline voltage node 406A, a bitline voltage node 406B, a bitline voltage node 406N, etc.) and a memory cell node (e.g., a memory cell node 408A, a memory cell node 408B, a memory cell node 408N, etc.) associated with a wordline. In one embodiment, each of the bitlines is controlled by single voltage control module (e.g., 409A, 409B, 409N, etc.), where the voltage control module includes a respective voltage level shifter (e.g., a voltage level shifter 410A, a voltage level shifter 410B, a voltage level shifter 410N, etc.) and a respective logic circuit (e.g., a NAND gate 414A, a NAND gate 414B, a NAND gate 414N, etc.).

In one exemplary embodiment, the bitline pass device is a thick oxide transistor, and the bitline pass device is enabled when the bitline is selected by maintaining the pass voltage differential (e.g., or the gate to source voltage difference when the bitline pass device is a NMOS) is greater than the threshold voltage of the bitline pass device. If the bitline is not selected, then a 0 volt supply is forwarded to the bitline pass device to turn it off.

For example, the bitline voltage may be a global array voltage at 1 volt. Additionally, the voltage level shifter forwards 3 volts by shifting from the positive supply voltage ($V_{cc}$) of about 1.8 volt when the bitline is selected. Accordingly, the bitline voltage system 400 passes the bitline voltage at 1 volt via the bitline when the bitline pass device is enabled by forwarding 3 volt to the bitline pass device. Alternatively, the memory cell is isolated from the bitline voltage if the bitline is not selected by forwarding 0 volt to the bitline pass device.

It is appreciated that the bitline voltage system 400 is able to pass a bitline voltage higher than 1 volt when the voltage level shifter is designed to forward a control voltage higher than 3 volts (e.g., a boosted voltage greater than $V_{cc}$). It is also appreciated that the logic circuit may be realized using one or more logic gates instead of the NAND gate illustrated in FIG. 4. It is further appreciated that one or more additional pass devices (e.g., for y-decoding for source path) may be coupled between the bitline voltage and the memory cell.

Figure 5:
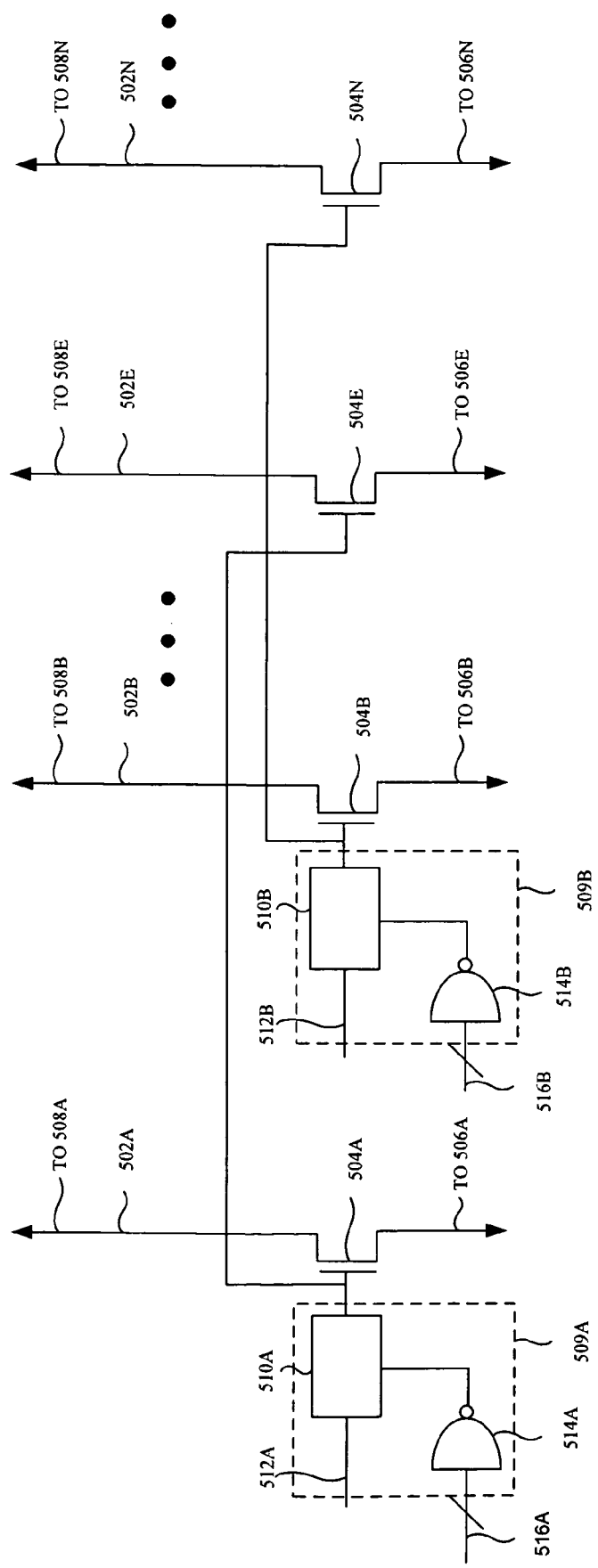
FIG. 5 is a block diagram of an exemplary bitline voltage system with a voltage control module shared by two or more bitlines in accordance with one embodiment of the present invention.

FIG. 5 is a block diagram of an exemplary bitline voltage system 500 with each voltage control module shared by two or more bitlines in accordance with one embodiment of the present invention. As illustrated in FIG. 5, a memory device may have multiple bitlines (e.g., 502A, 502B, 502N, etc.). A respective bitline pass device (e.g., a bitline pass device 504A, a bitline pass device 504B, a bitline pass device 504N, etc.) on each of the respective bitlines is coupled between a bitline voltage node (e.g., a bitline voltage node 506A, a bitline voltage node 506B, a bitline voltage node 506N, etc.) and a memory cell node (e.g., a memory cell node 508A, a memory cell node 508B, a memory cell node 508N, etc.) associated with a wordline. It is appreciated that the bitline voltage system 500 operates similar to the bitline voltage system 400 of FIG. 4.

In one embodiment, the voltage level adjuster (e.g., the voltage level shifter) is shared by one or more bitlines of a memory device as illustrated in FIG. 5. For example, each voltage level adjuster can be shared by four memory cells associated with four wordlines (e.g., wordlines 0 associated with the memory cell node 508A and wordlines 4, 8 and 12 not shown in FIG. 5), thereby grouping the bitlines together for programming. By sharing the voltage level adjuster, the layout pitch of the memory device may be relaxed, thus saving die space. Furthermore, a plurality of bitlines may be selected to read the memory cells. This method may be practical when an application calls for the grouping of multiple bitlines. In one exemplary embodiment, any combination of 2048, 1024, 512, 256, 128, 64, 32, 16, 8, 4 or 2 bitlines may be in one group.

Figure 6:
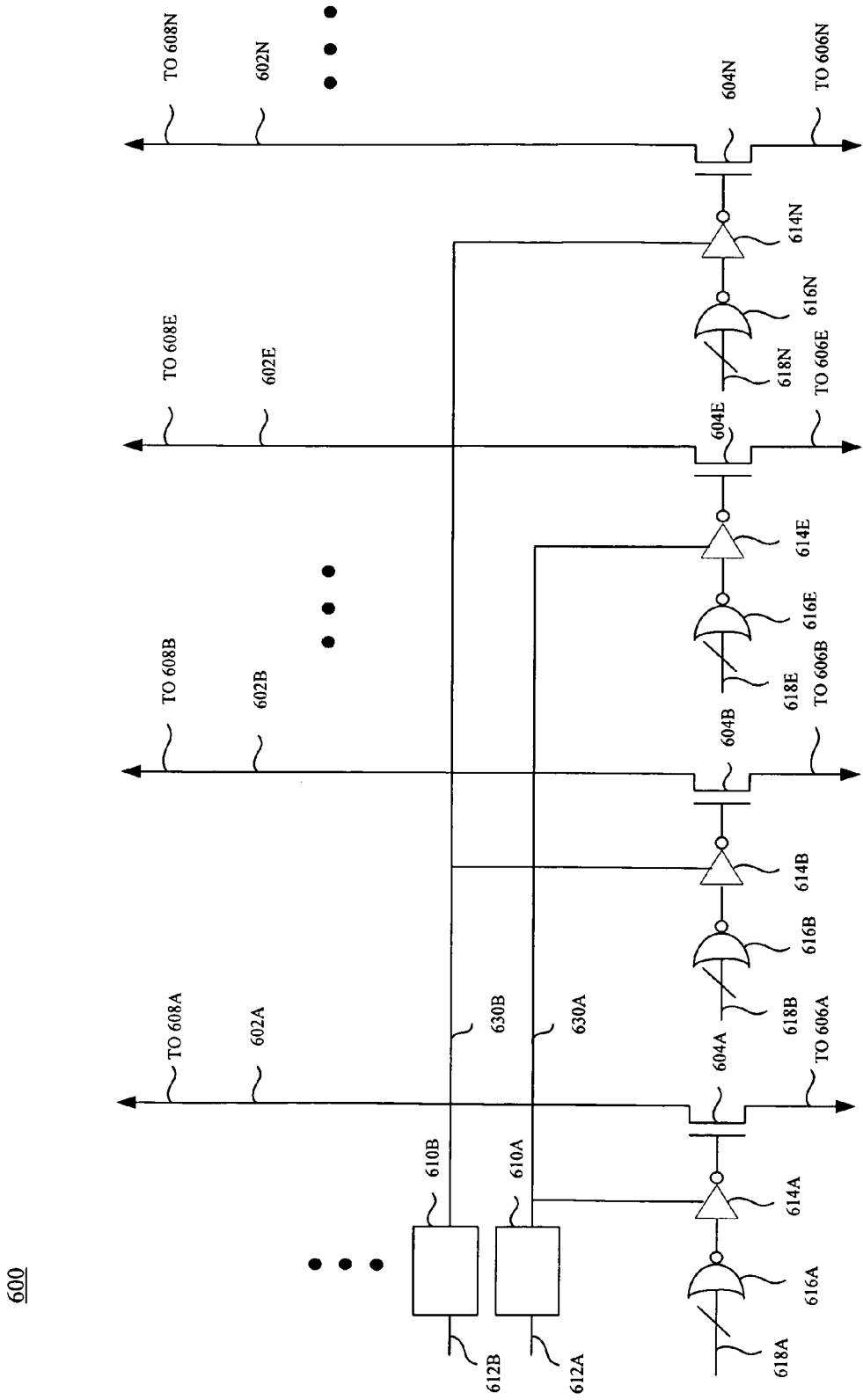
FIG. 6 is another block diagram of an exemplary bitline voltage system with a voltage control module in accordance with one embodiment of the present invention.

FIG. 6 illustrates a block diagram of an exemplary bitline voltage system 600 with a voltage control module comprising a voltage level shifter, a logic circuit and an inverter in accordance with one embodiment of the present invention. The bitline voltage system 600 includes a high voltage level shifter with an inverter driven by a low voltage logic circuit based on the condition of the source (e.g., selected or deselected).

As illustrated in FIG. 6, a memory device may have multiple bitlines (e.g., 602A, 602B, 602E, 602N, etc.). A bitline pass device (e.g., a bitline pass device 604A, a bitline pass device 604B, a bitline pass device 604E, a bitline pass device 604N, etc.) on each of the bitlines is coupled between a bitline voltage node (e.g., a bitline voltage node 606A, a bitline voltage node 606B, a bitline voltage node 606E, a bitline voltage node 606N, etc.) and a memory cell node (e.g., a memory cell node 608A, a memory cell node 608B, a memory cell node 608E, a memory cell node 608N, etc.) associated with a wordline. The bitlines are controlled by a voltage control module, where the voltage control module includes a voltage level shifter (e.g., a voltage level shifter 610A, a voltage level shifter 610B, etc.) and a logic circuit (e.g., a NOR gate 616A, a NOR gate 616B, a NOR gate 616E and a NOR gate 616N, etc.). The logic circuit is powered by the positive supply voltage (e.g., 1.8 volt).

In one exemplary embodiment, a high voltage (e.g., from a global line 612A, a global line 612B, etc.) is provided to the inverters through local lines (e.g., a local line 630A, a local line 630B, etc.) to enable the bitline pass devices. Each of the bitline pass devices may belong to a bank or a group of bitlines. In FIG. 6, the bitline 602A and the bitline 602E are grouped into a bank which shares the global line 612A, the voltage level shifter 610A and the local line 630A. The bitline 602B and the bitline 602N are grouped into another bank which shares the global line 612B, the voltage level shifter 610B and the local line 630B.

In one exemplary embodiment, the voltage control module includes a thick or thin oxide inverter (e.g., an inverter 614A, an inverter 614B, an inverter 614C, and an inverter 614D) coupled between the logic circuit and the bitline pass device and between the voltage level shifter and the bitline pass device. To reduce crowbar current in the inverters 614A and 614E which are grouped together and have the same HV supply voltage (e.g., 3 volt) from 630A, the bitline control signals 618A and 618E need to be selected (e.g., 1.8 Volt) at the same time, This is because the power supply to the NOR gate is (VCC=1.8 Volt)

In the bitline voltage system 600 illustrated in FIG. 6, there may be four voltage level shifters (e.g., a voltage level shifter 610A, a voltage level shifter 610B, a voltage level shifter 610C and a voltage level shifter 610D, where the latter two are not shown) providing a control voltage to each of the four bitline groups in all input and outputs. In one exemplary implementation, during programming, each programming group may be selected and the control voltage to the bitline pass device is set at greater than the bitline voltage by at least the threshold voltage of the bitline pass device to turn the bitline pass device on. If the bitline is not selected, the positive supply voltage ($V_{cc}$ 1.8 Volt) is supplied to the supply voltage of the inverter. The logic input will then be used to disable the bitline pass device.

It is appreciated that the bitline voltage system 600 is able to pass a bitline voltage higher than 1 volt when the voltage level shifter is designed to forward a control voltage higher than 3 volts, where a gate to a channel (bulk) voltage is less than or equal to the maximum allowed supply voltage of the memory device. It is also appreciated that the logic circuit may be realized using a variety of logic gate configurations instead of the NOR gate illustrated in FIG. 6.

Figure 7:
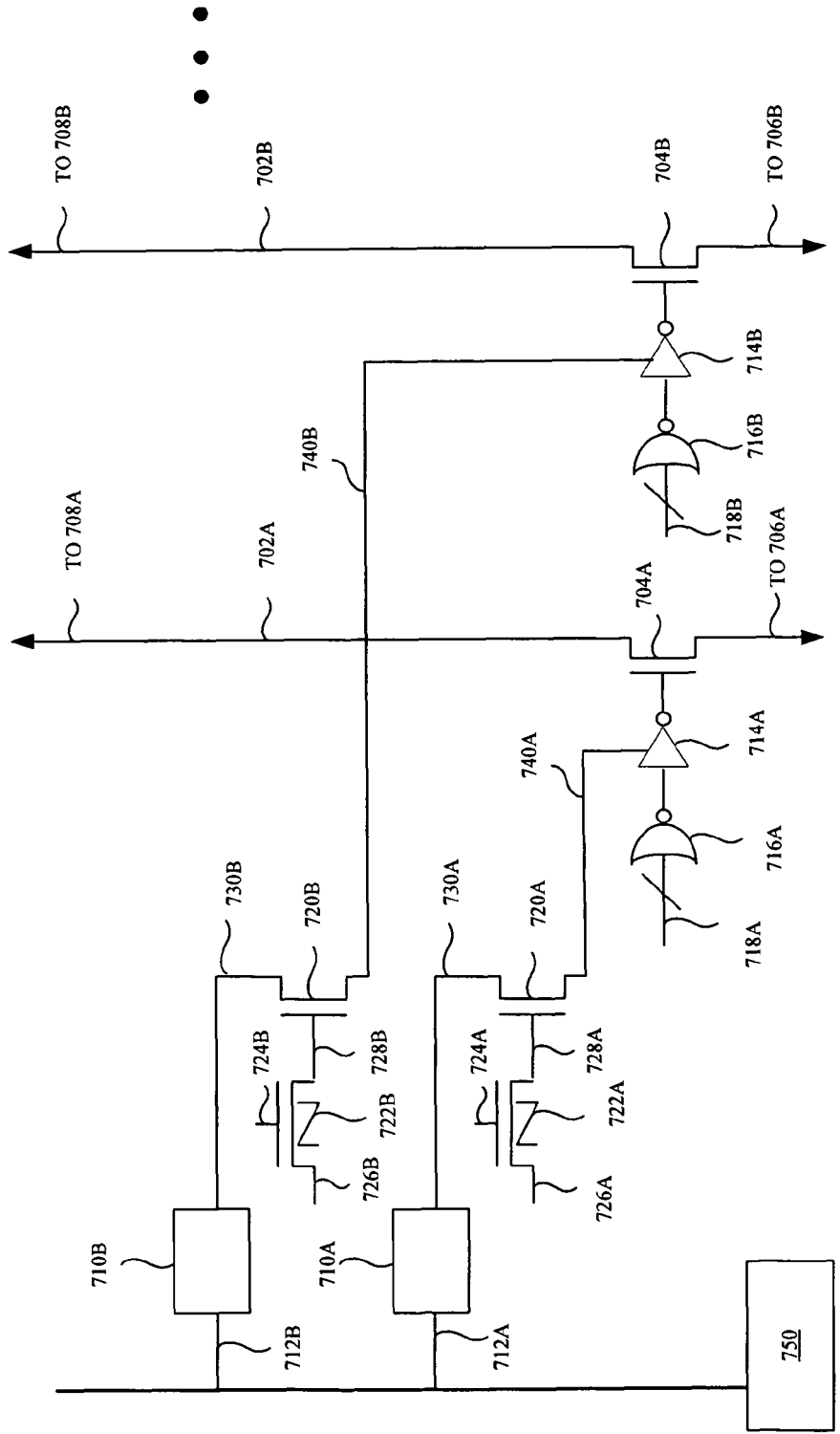
FIG. 7 is another block diagram of an exemplary bitline voltage system with a voltage control module in accordance with one embodiment of the present invention.

FIG. 7 illustrates a block diagram of an exemplary bitline voltage system with a voltage control module comprising a voltage level shifter, an intrinsic device, a zero threshold transistor, a logic circuit and an inverter in accordance with one embodiment of the present invention.

As illustrated in FIG. 7, a memory device may have multiple bitlines (e.g., 702A, 702B, etc.). A bitline pass device (e.g., a bitline pass device 704A, a bitline pass device 704B, etc.) on each of the bitlines is coupled between a bitline voltage node (e.g., a bitline voltage node 706A, a bitline voltage node 706B, etc.) and a memory cell node (e.g., a memory cell node 708A, a memory cell node 708B, etc.) associated with a wordline. The voltage control module includes a voltage level shifter (e.g., a voltage level shifter 710A, a voltage level shifter 710B, etc.), an intrinsic device (e.g., an intrinsic device 720A, an intrinsic device 720B, etc.), a zero threshold device (e.g., a zero threshold transistor 722A, a zero threshold transistor 722B, etc.), an inverter (e.g., an inverter 714A, an inverter 714B, etc.) and a logic circuit (e.g., a NOR gate 716A, a NOR gate 716B, etc.). In one example embodiment, the intrinsic device controlled by the zero threshold device is coupled between the voltage level shifter and the inverter.

In the bitline voltage system 700 illustrated in FIG. 7, each voltage level shifter provides power (e.g., 1.8 volt, 3 volts, etc.) to each of the multiple bitlines in inputs and outputs through local lines (e.g., a local line 740A, a local line 740B, etc.). The output of each voltage level shifter (e.g., an output voltage 730A, an output voltage 730B, etc.) is coupled to one of many banks (e.g., groups of bitlines) present in the memory device illustrated in FIG. 7. A global voltage supply 750 supplies a high voltage to the voltage level shifters. During programming, each programming group may be selected and the control voltage to the bitline pass device is set at greater than the bitline voltage by at least the threshold voltage of the bitline pass device to turn the bitline pass device on. During the process, each bitline is decoded locally by the zero threshold device and the intrinsic device.

In one exemplary implementation, when both the bitline 702A and its bank (e.g., which has many bitlines in the particular group) are selected, a gate 724A and a drain 726A of the zero threshold device 722A gets a high voltage (e.g., approximately 7 volts). Since there is no threshold voltage in the zero threshold device 722A, the voltage seen at a gate 728A of the intrinsic device 720A is close to the high voltage. The selected bitline level shifter 710A will pass in a high voltage (e.g., 3 volts) from 712A to 730A. The bitline 702A is driven high (e.g., 1 volt) by 706A through the pass gate 704A. It is enabled by the bitline control signal 718A where the inverter 714A is supplied with a high voltage (e.g., 3 volts) from the global line 730A through the local line 740A.

In one exemplary implementation, when the bitline 702B is not selected but its bank is selected, a gate 724B and a drain 726B of the zero threshold device 722B gets a high voltage (e.g., approximately 7 volts). Since there is no threshold voltage in the zero threshold device 722B, the voltage seen at a gate 728B of the intrinsic device 720B is close to the high voltage. The unselected bitline level shifter 710B will pass in a high voltage (e.g., 1.8 volts) to 730B. The bitline 702B is floating and disabled by the bitline control signal 718B where the inverter 714B is powered by a high voltage (e.g., 1.8 volts) which comes from the global line 730B through the local line 740B.

In one exemplary implementation, when the bitline 702A is selected but its bank is not selected, a gate 724A gets 1.8 volt and a drain 726A of the zero threshold device 722A gets 0 volt. Accordingly, the node at the local line 740A is floating because the gate of 720A is at 0 volt. The bitline 702A is floating even though it is enabled by the bitline control signal 718A. This voltage condition in the unselected bank would not affect the operation of the selected bitline in the selected bank.

In one exemplary implementation, when both the bitline 702B and its bank are not selected, a gate 724B gets 1.8 volt and a drain 726B of the zero threshold device 722B gets 0 volt. Accordingly, the node at the local line 740B is floating because the gate of 720B is at 0 volt. The bitline 702B is floating even though it is disabled by the bitline control signal 718B. This voltage condition in the unselected bank would not affect the operation of the unselected bitline in the selected bank.

The high voltage from 750 is set high enough to pass the bitline voltage through the pass transistor 704A and 704B. This high voltage is applied through the thick oxide inverter 714A and 714B. The low voltage at the gate of 720A and 720B in the unselected banks turns off the intrinsic device, and this reduces the total load seen by the voltage level shifter on global lines 730A and 730B. It is appreciated that one designated bit in each of the bitline control signal (e.g., a bitline control signals 718A, 718B, etc.) is available to select to have the source to show up. In addition, the bitline control signal 718A or the bitline control signal 718B may be a global signal for its respective bank.

Figure 8:
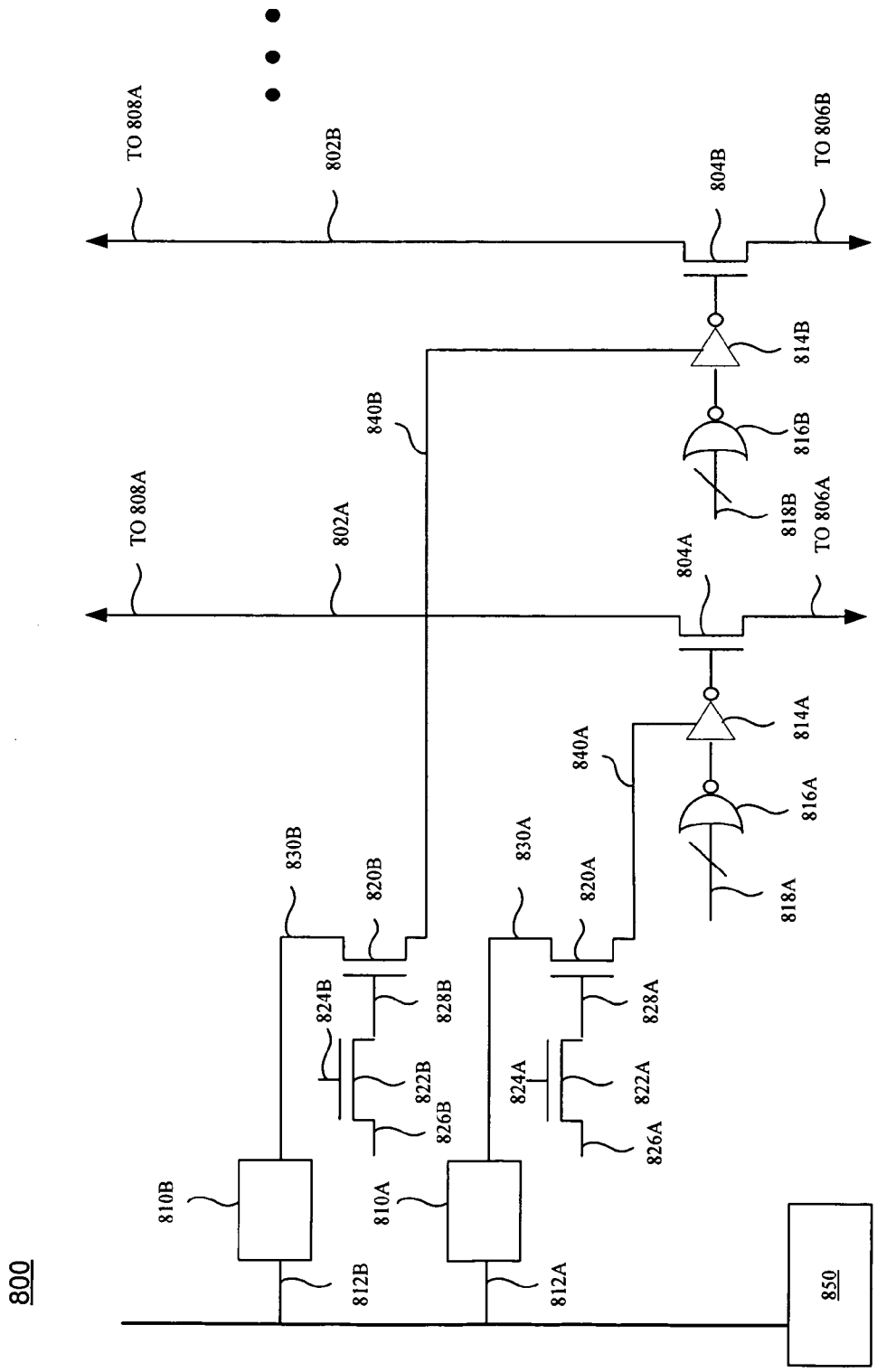
FIG. 8 is another block diagram of an exemplary bitline voltage system with a voltage control module in accordance with one embodiment of the present invention.

FIG. 8 illustrates a block diagram of an exemplary bitline voltage system 800 with a voltage control module comprising a voltage level shifter, two intrinsic devices, a logic circuit and an inverter in accordance with one embodiment of the present invention. The bitline voltage system 800 is similar to the bitline voltage system 700 of FIG. 7, except that an intrinsic control device (e.g., an intrinsic control device 822A, an intrinsic control device 822B, etc.) with a small threshold voltage (e.g., 0.2 volt) is used in place of the zero threshold device. Thus the voltage conditions on the drains and gates of the intrinsic transistors are similar to those of the zero threshold devices in FIG. 7. It is appreciated that using the intrinsic control devices enables a tighter layout of the bitline voltage system since they can share wells with other intrinsic devices in the system and their minimum channel length (e.g., 0.7 um) is smaller than the minimum channel length of the zero threshold devices (e.g., the channel length for typical z-transistors is 1.3 um).

The source of the intrinsic control device or the gate of an intrinsic device (e.g., an intrinsic device 820A, an intrinsic device 820B, etc.) is precharged to the high voltage minus the threshold voltage of the intrinsic control device. In one example embodiment, even at the high voltage minus the threshold voltage of the intrinsic control device, the intrinsic device 820A is still able to pass the high voltage from 830A to 840A for the selected bitline.

Figure 9:
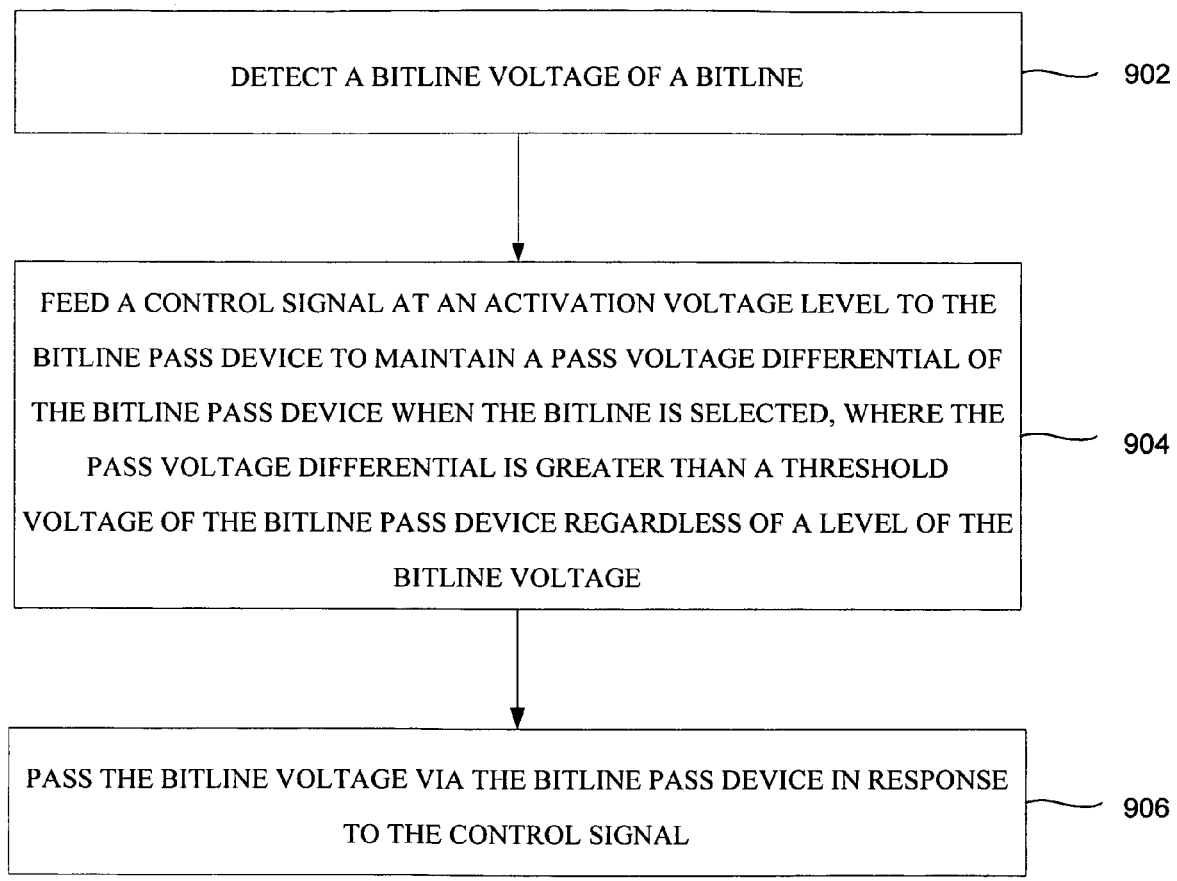
FIG. 9 illustrates a flow chart of an exemplary bitline pass method for passing a bitline voltage via a bitline in a memory device in accordance with one embodiment of the present invention.

FIG. 9 illustrates a flow chart of a bitline voltage pass method for passing a bitline voltage via a bitline in a memory device in accordance with one embodiment of the present invention. In operation 902, the bitline voltage of the bitline is detected. In one exemplary implementation, the detection of the bitline voltage can be done automatically by measuring the level of the bitline voltage and routing the finding to the voltage control module. This in turn would allow for the bitline voltage system to adjust the control signal forward to the bitline pass device on the fly in response to any change in the bitline voltage. Alternatively, the detection can be done by supplying a voltage level configuration signal which informs the system the level of the bitline voltage until there is any change.

In operation 904, a control signal at an activation voltage level is fed to the bitline pass device to maintain a pass voltage differential of the bitline pass device when the bitline is selected, where the pass voltage differential is greater than a threshold voltage of the bitline pass device regardless of a level of the bitline voltage which is only limited by a breakdown voltage of the bitline pass device.

In one embodiment, the activation voltage level is selected based on the bitline voltage, the threshold voltage and a positive supply voltage ($V_{cc}$) of the memory device. In another example embodiment, the control signal at a deactivation voltage level is fed to the bitline pass device to turn off the bitline pass device, where the deactivation voltage level is based on the bitline voltage, the threshold voltage and a positive supply voltage ($V_{cc}$) of the memory device.

In operation 906, the bitline is passed via the bitline pass device in response to the control signal. The passing of the bitline voltage takes place as the bitline pass device is enabled. Accordingly, the drain or source of a memory cell or memory cells associated with the bitline can be programmed or read.

In summary, embodiments described herein pertain to methods and systems that pass a bitline voltage regardless of its level via a selected bitline. By maintaining the pass voltage differential of the bitline pass device, the embodiments allow to pass a bitline voltage at various voltage levels.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A bitline voltage system, comprising:
   a bitline pass device for passing a bitline voltage via a bitline; and
   a voltage control module to control the bitline pass device,
      wherein the control comprises maintaining a pass voltage differential that enables the bitline pass device to pass the bitline voltage when the bitline is selected; and
      wherein the pass voltage differential is greater than a threshold voltage of the bitline pass device regardless of a level of the bitline voltage which is limited by a breakdown voltage of the bitline pass device.

2. The system of claim 1, wherein the voltage control module is a variable voltage control module for forwarding a control signal in response to various voltage levels in the bitline voltage.

3. The system of claim 1, wherein the pass voltage differential is less than a positive supply voltage ($V_{cc}$) of the memory device minus the threshold voltage.

4. The system of claim 1, wherein the bitline pass device is coupled between a node at the bitline voltage and a memory cell node.

5. The system of claim 1, wherein the bitline pass device comprises a pass transistor.

6. The system of claim 1, wherein the bitline voltage comprises a voltage greater than a positive supply voltage (Vcc) subtracted by the pass voltage differential.

7. The system of claim 1, wherein the voltage control module comprises a voltage level adjuster for forwarding a control signal for controlling the bitline pass device.

8. The system of claim 7, wherein the voltage level adjuster is shared by at least one additional bitline of a memory device comprising the bitline.

9. The system of claim 7, wherein the voltage control module further comprises a logic circuit to select a voltage level of the control signal based on at least one bitline control signal.

10. The system of claim 7, wherein the variable voltage control module further comprises an inverter coupled between the voltage level adjuster and the bitline pass device.

11. The system of claim 9, wherein the variable voltage control module further comprises an intrinsic device coupled between the voltage level adjuster and the inverter.

12. The system of claim 10, wherein the intrinsic device is controlled by at least one of a zero threshold transistor and another intrinsic device.

13. A voltage bitline control module in a memory device, comprising:
   a voltage level adjuster for forwarding a control signal to control a bitline pass device; and
   a bitline select module to select a voltage level of the control signal,
      wherein the control signal is at an activation voltage level that maintains a pass voltage differential regardless of a bitline voltage level when a bitline associated with the bitline pass device is selected and the control signal is at a deactivation voltage level that turns off the bitline pass device when the bitline is not selected; and
      wherein the bitline voltage is limited by a breakdown voltage of the bitline pass device.

14. The control module of claim 13, wherein the voltage level of the control signal is determined based on at least one of the bitline voltage, a threshold voltage of the bitline pass device, a positive supply voltage ($V_{cc}$) and at least one bitline control signal of the memory device.

15. The control module of claim 14, wherein the bitline select module comprises a logic circuit to select between the activation voltage level and the deactivation voltage level based on the at least one bitline control signal.

16. The control module of claim 13, wherein the voltage level of the control signal is configured in response to a voltage level configuration signal.

17. The control module of claim 13, wherein the voltage level adjuster is a voltage level shifter, a multiplexer or a voltage divider.

18. A bitline voltage pass method, comprising:
   detecting a bitline voltage of a bitline with a bitline pass device;
   feeding a control signal at an activation voltage level to a bitline pass device to maintain a pass voltage differential of the bitline pass device when the bitline is selected; and
   passing the bitline voltage via the bitline pass device in response to the control signal,
      wherein the pass voltage differential is greater than a threshold voltage of the bitline pass device regardless of a level of the bitline voltage limited by a breakdown voltage of the bitline pass device.

19. The method of claim 18, wherein the feeding the control signal further comprises selecting the activation voltage level based on the bitline voltage, the threshold voltage and a positive supply voltage ($V_{cc}$) of a memory device.

20. The method of claim 18, further comprising feeding the control signal at a deactivation voltage level to the bitline pass device to turn off the bitline pass device, wherein the deactivation voltage level is based on the bitline voltage, the threshold voltage and a positive supply voltage ($V_{cc}$) of a memory device.

* * * * *